United States Patent
Pagano et al.

(10) Patent No.: US 10,199,818 B2
(45) Date of Patent: Feb. 5, 2019

(54) SYSTEM AND METHOD FOR WIRELESS POWER TRANSFER USING OVER-VOLTAGE PROTECTION

(71) Applicant: INTEGRATED DEVICE TECHNOLOGY, INC., San Jose, CA (US)

(72) Inventors: Rosario Pagano, Chandler, AZ (US); Herman R. Paz, Avondale, AZ (US); Siamak Abedinpour, Scottsdale, AZ (US)

(73) Assignee: Integrated Device Technology, Inc., San Jose, CA (US)

(*) Notice: Subject to any disclaimer, the term of this patent is extended or adjusted under 35 U.S.C. 154(b) by 307 days.

(21) Appl. No.: 15/089,413

(22) Filed: Apr. 1, 2016

(65) Prior Publication Data

US 2016/0294180 A1    Oct. 6, 2016

Related U.S. Application Data

(60) Provisional application No. 62/142,861, filed on Apr. 3, 2015.

(51) Int. Cl.
| | |
|---|---|
| *H02H 3/20* | (2006.01) |
| *H03K 17/0412* | (2006.01) |
| *H03K 17/04* | (2006.01) |
| *H03K 17/041* | (2006.01) |
| *H02J 50/10* | (2016.01) |
| *H02J 50/20* | (2016.01) |
| *H02J 50/80* | (2016.01) |

(52) U.S. Cl.
CPC .............. *H02H 3/20* (2013.01); *H02J 50/10* (2016.02); *H02J 50/20* (2016.02); *H03K 17/04* (2013.01); *H03K 17/041* (2013.01); *H03K 17/04123* (2013.01); *H02J 50/80* (2016.02)

(58) Field of Classification Search
CPC ........ H02H 3/20; H03K 17/04; H03K 17/041; H03K 17/04123
See application file for complete search history.

(56) References Cited

U.S. PATENT DOCUMENTS

| | | | | |
|---|---|---|---|---|
| 5,371,415 | A * | 12/1994 | Dixon | H03K 17/04123 327/108 |
| 6,606,227 | B2 * | 8/2003 | Rapsinski | H02H 9/042 307/10.2 |
| 7,151,401 | B2 * | 12/2006 | Inoue | H03K 17/0406 327/434 |
| 7,382,167 | B1 * | 6/2008 | Umminger | G06F 1/28 327/76 |

* cited by examiner

*Primary Examiner* — Scott Bauer
(74) *Attorney, Agent, or Firm* — Haynes and Boone, LLP.

(57) ABSTRACT

A system and method of over-voltage protection includes a switch coupled between a power source and a load, a detection circuit configured to detect an onset of an over-voltage event at the load; and a driver circuit coupled to the switch and the detection circuit. The driver circuit includes a boost sub-circuit that provides a low-resistance path for opening the switch in a boost mode, the boost mode being triggered by the onset of the over-voltage event and having a predetermined duration and a steady state sub-circuit that provides a high-resistance path for holding the switch open during steady state operation when the boost mode.

17 Claims, 9 Drawing Sheets

SYSTEM AND METHOD FOR WIRELESS POWER TRANSFER USING OVER-VOLTAGE PROTECTION

RELATED APPLICATIONS

The present application claims priority to U.S. Provisional Application Ser. No. 62/142,861, filed on Apr. 3, 2015, which is herein incorporated by reference in its entirety.

TECHNICAL FIELD

The present disclosure relates generally to wireless power transfer and more particularly to wireless power transfer using over-voltage protection.

BACKGROUND

Wireless power transfer offers a convenient technique for conveying electrical power without the use of traditional electrical cords. Among other advantages, wireless power transfer reduces safety hazards associated with cords, such as tripping and fire hazards, and improves aesthetics by reducing cord clutter. Still further, wireless power transfer is a low-hassle and cost-effective alternative to wired charging for portable electronics. For example, for portable electronics that are charged daily, wireless power transfer reduces the likelihood of misplacing wired chargers and prevents wear-and-tear associated with repeatedly plugging and unplugging the devices.

Accordingly, it would be desirable to provide improved wireless power transfer systems.

SUMMARY

Consistent with some embodiments an over-voltage protection system includes a switch coupled between a power source and a load, a detection circuit configured to detect an onset of an over-voltage event at the load; and a driver circuit coupled to the switch and the detection circuit. The driver circuit includes a boost sub-circuit that provides a low-resistance path for opening the switch in a boost mode, the boost mode being triggered by the onset of the over-voltage event and having a predetermined duration and a steady state sub-circuit that provides a high-resistance path for holding the switch open during steady state operation when the boost mode ends.

Consistent with some embodiments an over-voltage protection circuit comprises a pass-gate transistor coupled between a power source and a load, an over-voltage detection circuit configured to detect a beginning of an over-voltage event at the load, and a driver circuit coupled to a gate of the pass-gate transistor. The driver circuit includes a boost sub-circuit that provides a low-resistance path for charging the gate of the pass-gate transistor in a boost mode, the boost mode being triggered by the beginning of the over-voltage event and having a predetermined duration and a steady state sub-circuit that provides a high-resistance path for maintaining the gate of the pass-gate transistor in a charged state during steady state operation.

Consistent with some embodiments a method includes determining whether a load voltage has increased above a first threshold value, opening an over-voltage protection switch using a boost mode when the load voltage has increased above first threshold value, and maintaining the over-voltage protection switch in an open state when the boost mode ends.

BRIEF DESCRIPTION OF THE DRAWINGS

In the figures, elements having the same designations have the same or similar functions.

DETAILED DESCRIPTION

In the following description, specific details are set forth describing some embodiments consistent with the present disclosure. It will be apparent to one skilled in the art, however, that some embodiments may be practiced without some or all of these specific details. The specific embodiments disclosed herein are meant to be illustrative but not limiting. One skilled in the art may realize other elements that, although not specifically described here, are within the scope and the spirit of this disclosure. In addition, to avoid unnecessary repetition, one or more features shown and described in association with one embodiment may be incorporated into other embodiments unless specifically described otherwise or if the one or more features would make an embodiment non-functional.

The benefits of wireless power transfer, discussed previously, may be enhanced when a wireless power system is configured to safely handle over-voltage events. Over-voltage events occur when an input voltage of a circuit is elevated above the design limit for a short and/or extended period of time. Over-voltage events may be hazardous to a user and/or bystander, for example, by causing electric shocks, arcs, and/or fires. Over-voltage events may damage equipment and/or property. To mitigate the risk of over-voltage events, many electronic devices use over-voltage protection circuits. However, conventional over-voltage protection circuits often include drivers that consume significant current during steady state operation (i.e., in the absence of an over-voltage event), reducing system efficiency. Accordingly, a wireless power transfer system with improved over-voltage protection circuitry would be desirable.

Figure 1:
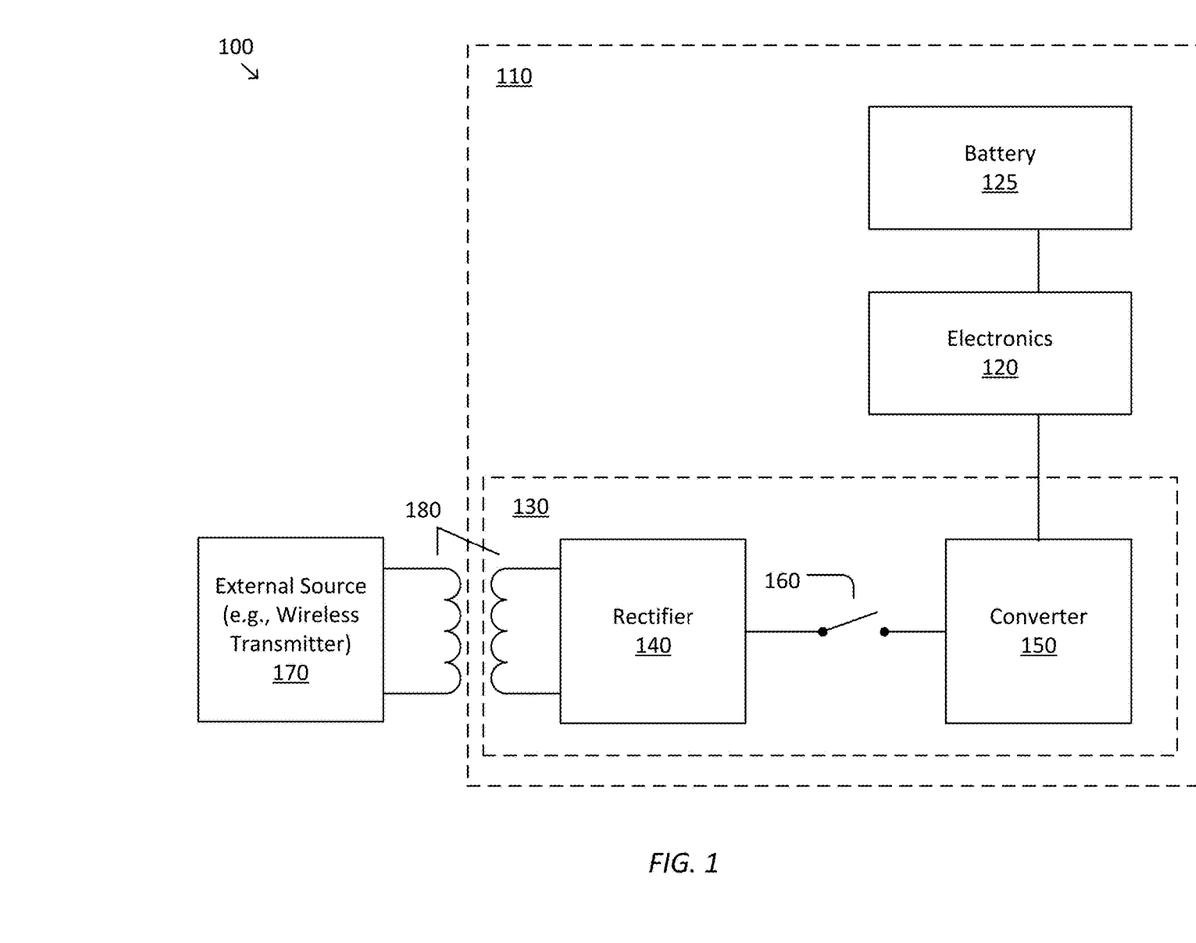
FIG. 1 is a simplified block diagram of an electronic system with over-voltage protection according to some embodiments.

FIG. 1 is a simplified block diagram of an electronic system 100 with over-voltage protection according to some embodiments. Electronic system 100 includes an electronic device 110. Electronic device 110 may be virtually any electronic device, such as a desktop or portable computer, a mobile computing device such as a smart phone or watch, a remote control, an electric and/or hybrid electric vehicle, and/or the like. Electronic device 110 may include one or more electronics modules 120 that serve as a load of the electronic system 100. Electronics module 120 may include any electronic component of the above mentioned electronic devices such as an integrated circuit, a display, an actuator, a sensor, a signal processor circuit, and/or the like and/or a combination thereof. In some examples, electronics module 120 may be coupled to a battery 125. Battery 125 serves as a load of electronic system 100 when charging and as a source of power when discharging. According to some examples, battery 125 may be charged when electronics module 120 is receiving power from an external power source and may be discharged when no external power source is available. Battery 125 may include any suitable energy storage device such as, without limitation, a lithium ion battery, a capacitor, a supercapacitor and/or the like.

Electronic device 110 receives power using a power supply 130. According to some embodiments, power supply 130 may include a rectifier 140 and a converter 150. Rectifier 140 performs alternating current (AC) to direct current (DC) conversion to convert received AC power into DC power. Rectifier 140 may use any suitable topology, or combination of topologies, such as full-bridge and/or half-bridge, and may be synchronous or asynchronous. Converter 150 performs DC-DC conversion to shift the voltage of the DC power for delivery to electronic module 120 and/or battery 125. Like rectifier 140, converter 150 may use any suitable topology, including synchronous or asynchronous topologies. For example, when converter 150 is a DC-DC switched mode converter, the topology of converter 150 may include buck, boost, buck-boost, flyback, forward, or any other suitable DC-DC switched mode topology.

Power supply 130 receives power from an external power source 170. As depicted in FIG. 1, power supply 130 may be configured as a wireless power receiver. In accordance with such embodiments, external power source 170 is configured as a wireless power transmitter. According to some examples, electromagnetic fields may be used to transmit power from external power source 170 to power supply 130. In some embodiments, when the electromagnetic fields include time-varying magnetic fields, external power source 160 may be coupled to power supply 130 using inductive, near-field, and/or resonant power transfer coupling mechanisms and/or the like. In furtherance of such embodiments, external power source 170 and power supply 130 may include inductive coils 180 for wireless power transfer. In addition to transmitting power from external power source 170 to electronic device 110, the electromagnetic fields may also be used to communicate data between electronic device 110 and external power source 170. That is, information may be encoded into the time-varying electromagnetic field on one side of the wireless power transfer system and decoded on the other side to establish wireless communication. Although FIG. 1 depicts wireless power transfer from external power source 170 to power supply 130, it is to be understood that power supply 130 may alternately, or additionally, be configured as a wired power supply. In furtherance of such embodiments, external power source 170 is configured to provide power over a wire. The wire may include any suitable conductor, such as a USB cable, an Ethernet cable, a dock connector, an AC power cord, a laptop charging cable, and/or the like. In addition to transporting electrical power, the cable may also be used to communicate data between electronic device 110 and external power source 170.

According to some embodiments, power supply 130 may include an over-voltage protection switch 160 that mitigates the risk of potentially damaging and/or dangerous over-voltage events associated with power supply 130. For example, over-voltage protection switch 160 may protect sensitive electronic components that are configured to receive power from power supply 130, such as electronics module 120 and/or battery 125. Alternately, and/or additionally, over-voltage protection switch 160 may protect sensitive electronic components within power supply 130, such as converter 150. According to some embodiments, over-voltage protection switch 160 may be coupled in series with other components of power supply 130. For example, as depicted in FIG. 1, over-voltage protection switch 160 may be coupled between rectifier 140 and converter 150. In some embodiments, over-voltage protection switch 160 may be selectively opened in order to disconnect converter 150 from rectifier 140 when an over-voltage event is detected, such as when an input voltage to converter 150 exceeds a first predetermined threshold. Consistent with such embodiments, over-voltage protection switch 160 may be closed to reconnect converter 150 to rectifier 140 when the over-voltage event ends, such as when the input voltage to converter 150 drops back below a second predetermined threshold. Although over-voltage switch 160 is depicted as being coupled between rectifier 140 and converter 150, it is to be understood that over-voltage protection switch 160 may be positioned between any power source and load so as to protect the load from over-voltage events originating from the source. In some examples, the power source and load are configured as DC power sources/loads.

In practice, operating over-voltage protection switch 160 inevitably consumes energy. For example, energy is typically consumed by processes including monitoring the system voltages to detect an over-voltage event, switching the state of over-voltage protection switch 160 at the beginning or end of an over-voltage event, and/or maintaining the state of over-voltage protection switch 160 between transitions. The energy consumed while operating over-voltage protection switch 160 may be especially high when a fast response time is desired, i.e., when over-voltage protection switch 160 is configured to provide maximum protection to downstream electronic components by opening and closing very quickly in response to over-voltage events. In many cases, the energy consumption when operating over-voltage protection switch 160 with a fast response time is high during all stages of operation, both during switching and during steady state operation between switching events. As a result, the design of many over-voltage protection systems involves an undesirable tradeoff between response time and energy consumption. Accordingly, it would be desirable to operate over-voltage protection switch 160 using an improved mechanism that achieves the benefits of both a fast response time and low energy consumption.

Figure 2:
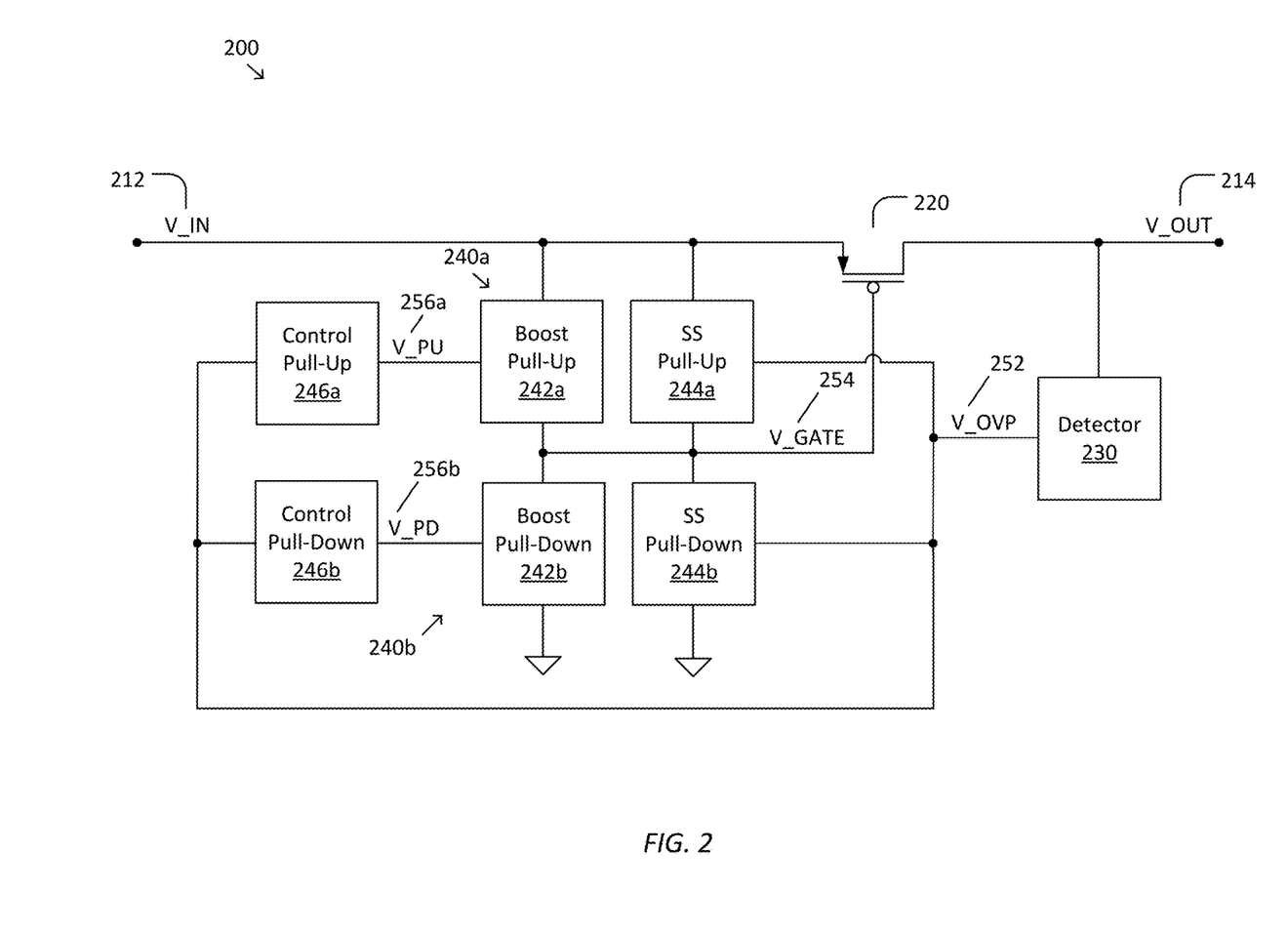
FIG. 2 is a simplified block diagram of an over-voltage protection system with a boost mode according to some embodiments.

FIG. 2 is a simplified block diagram of an over-voltage protection system 200 with a boost mode according to some embodiments. In some embodiments consistent with FIG. 1, over-voltage protection system 200 may be used to implement at least some portions of power supply 130, including over-voltage protection switch 160. Over-voltage protection system 200 is coupled between an input voltage 212 (V_IN) and an output voltage 214 (V_OUT). According to some embodiments, input voltage 212 may be connected to a power source, such as rectifier 140, and output voltage 214 may be connected to a load, such as converter 150.

Over-voltage protection system 200 includes an over-voltage protection switch 220 coupled between input voltage 212 and output voltage 214. According to some embodiments, over-voltage protection switch 220 may be implemented using one or more transistors, such as metal oxide semiconductor field effect transistors (MOSFETs) and/or insulated gate bipolar transistors (IGBTs). Each transistor has a source, gate, and drain and is turned on and off by applying a gate voltage relative to the source voltage. Transistors may be classified as n-type transistors (e.g., NMOS) and/or p-type transistors (e.g., PMOS). An n-type transistor is turned on when the gate voltage exceeds the source voltage by at least a threshold voltage, and a p-type transistor is turned on when the gate voltage is lower than the source voltage by at least threshold voltage. As depicted in FIG. 2, over-voltage protection switch 220 is implemented using a PMOS transistor with the source coupled to input voltage 212 and the drain coupled to output voltage 414. In this configuration, over-voltage protection switch 220 may be referred to as a pass-gate transistor.

An over-voltage event detector 230 monitors output voltage 214. When over-voltage event detector 230 detects an over-voltage event associated with output voltage 214, over-voltage event detector 230 generates an over-voltage event indicator 252 (V_OVP). For example, during an over-voltage event, over-voltage event detector 230 may signal the occurrence of the over-voltage event by setting over-voltage event indicator 252 to a high voltage level. At other times, over-voltage event indicator 252 may be set to a low voltage level. In some embodiments, over-voltage event detector 230 may detect the beginning of an over-voltage event by determining when output voltage 214 increases above a first threshold voltage. In some embodiments, over-voltage event detector 230 may detect the end of an over-voltage event by determining when output voltage 214 decreases below a second threshold voltage. Although the first and second threshold voltages may be the same in some embodiments, in a typical embodiment the second threshold voltage is lower than the first threshold voltage. The difference between the two threshold voltages results in hysteresis, which reduces the switching frequency and improves the energy efficiency of over-voltage protection system 200.

A pull-up driver circuit 240a includes a boost subcircuit 242a, a steady state subcircuit 244a, and a control subcircuit 246a. Similarly, a pull-down driver circuit 240b includes a boost subcircuit 242b, a steady state subcircuit 244b, and a control subcircuit 246b. Pull-up driver circuit 240a and pull-down driver circuit 240b operate over-voltage protection switch 220 by generating a gate voltage 254 (V_GATE) that drives the gate of over-voltage protection switch 220.

Pull-up driver circuit 240a is responsible for turning off over-voltage protection switch 220 in response to an over-voltage event. When over-voltage event indicator 252 transitions from low to high, indicating the onset of an over-voltage event, steady state subcircuit 244a responds by providing a high resistance path between gate voltage 254 and input voltage 212. Meanwhile, control subcircuit 246a responds by generating a voltage pulse 256a (V_PU). For the duration of the voltage pulse 256a, pull-up driver circuit 240a enters a boost mode. In boost mode, boost sub-circuit 242a provides a low resistance path between gate voltage 254 and input voltage 212 to rapidly charge the gate of over-voltage protection switch 230. Because gate voltage 254 is coupled to input voltage 212 through at least one of the high resistance path and the low resistance path throughout the over-voltage event, the gate-to-source voltage of over-voltage protection switch 220 approaches zero and the switch turns off (i.e., over-voltage protection switch 220 becomes non-conducting between input voltage 212 and output voltage 214).

Similarly, pull-down driver circuit 240b is responsible for turning on over-voltage protection switch 220 at the end of the over-voltage event. When over-voltage event indicator 252 transitions from high to low, indicating the end of the over-voltage event, steady state subcircuit 244b responds by providing a high resistance path between gate voltage 254 and ground. Meanwhile, pull-down control subcircuit 246b responds by generating a voltage pulse 256b (V_PD). For the duration of voltage pulse 256b, pull-down driver circuit 240a enters boost mode. During boost mode, boost sub-circuit 242b provides a low resistance path between gate voltage 254 and ground to rapidly discharge the gate of over-voltage protection switch 230. Because gate voltage 254 is coupled to ground through one or more of the high resistance path and the low resistance path in the absence of an over-voltage event, the gate-to-source voltage of over-voltage protection switch 220 becomes non-zero and the switch turns on (i.e., over-voltage protection switch 220 becomes conducting between input voltage 212 and output voltage 214).

During boost mode, the gate of over-voltage protection switch 230 is rapidly charged and discharged through the low-resistance paths provided by boost sub-circuits 242a-b. Accordingly, over-voltage protection system 200 responds quickly to an over-voltage event, rapidly opening and closing the connection between input voltage 212 and output voltage 214 to mitigate damage. During steady state (i.e., after boost mode ends), steady state sub-circuits 244a-b maintain the state of over-voltage protection switch 220 through high-resistance paths provided by steady state sub-circuits 244a-b, rather than the low-resistance paths of boost sub-circuits 242a-b. Accordingly, over-voltage protection system 200 draws very little steady-state current. As a result, over-voltage protection system 200 delivers both fast response time and high energy efficiency.

Figure 3:
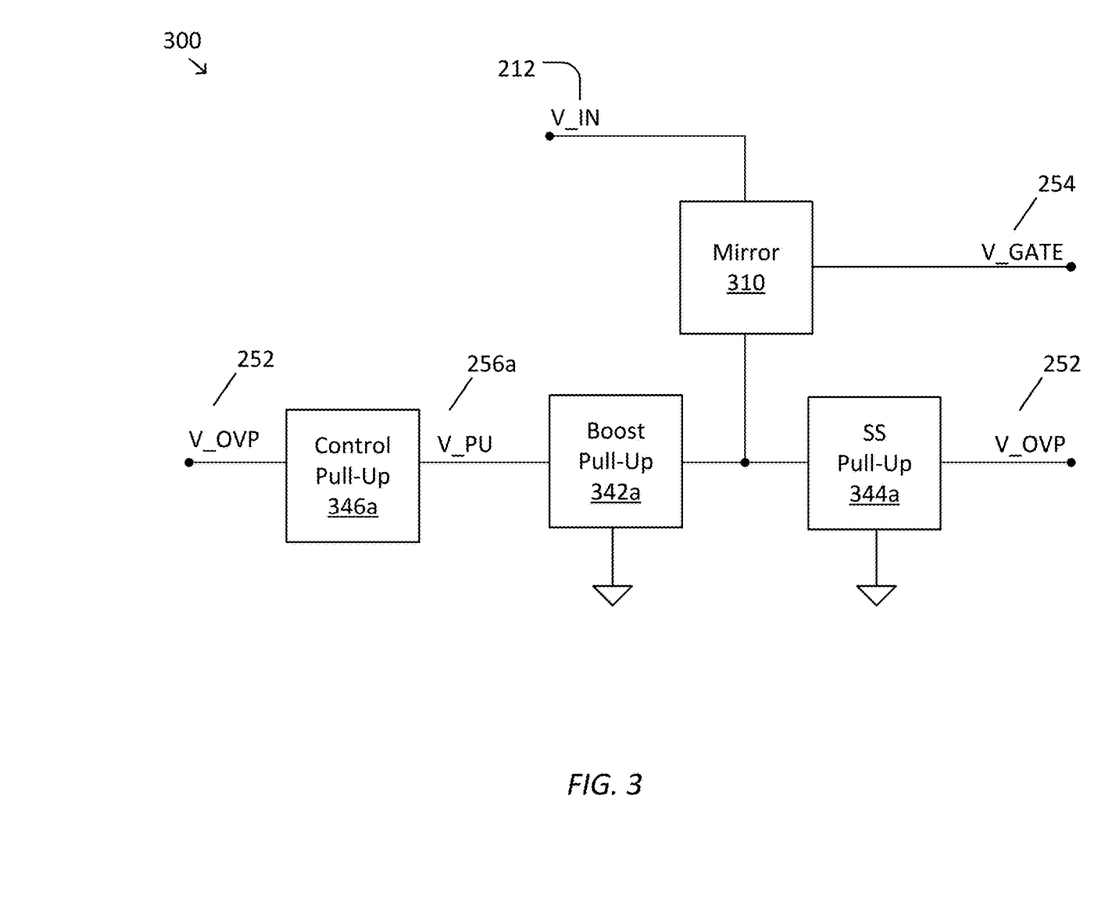
FIG. 3 is a simplified block diagram of a pull-up driver circuit with a current mirror according to some examples.

FIG. 3 is a simplified block diagram of a pull-up driver circuit 300 with a current mirror 310 according to some examples. According to some embodiments, pull-up driver circuit 300 represents an alternate configuration of pull-up driver circuit 240a depicted in FIG. 2. Like pull-up driver circuit 240a, pull-up driver circuit 300 includes a boost sub-circuit 342a, a steady state sub-circuit 344a, and a control sub-circuit 346a. However, rather than being directly coupled between input voltage 212 and gate voltage 254, as depicted in FIG. 2, boost sub-circuit 342a and steady state sub-circuit 344a are coupled to input voltage 212 and gate voltage 254 through a current mirror 310. During boost mode, boost sub-circuit 342a draws a large current between input voltage 212 and ground through current mirror 310. Current mirror 310 correspondingly draws a matching large current between nodes input voltage 212 and gate voltage 254, thereby rapidly charging the gate of over-voltage protection switch 230. During steady state operation, boost sub-circuit 342a turns off and steady state sub-circuit 344a draws a comparatively small current between input voltage 212 and ground through current mirror 310, thereby maintaining the gate voltage of over-voltage protection switch 230 with low energy losses.

Figure 4:
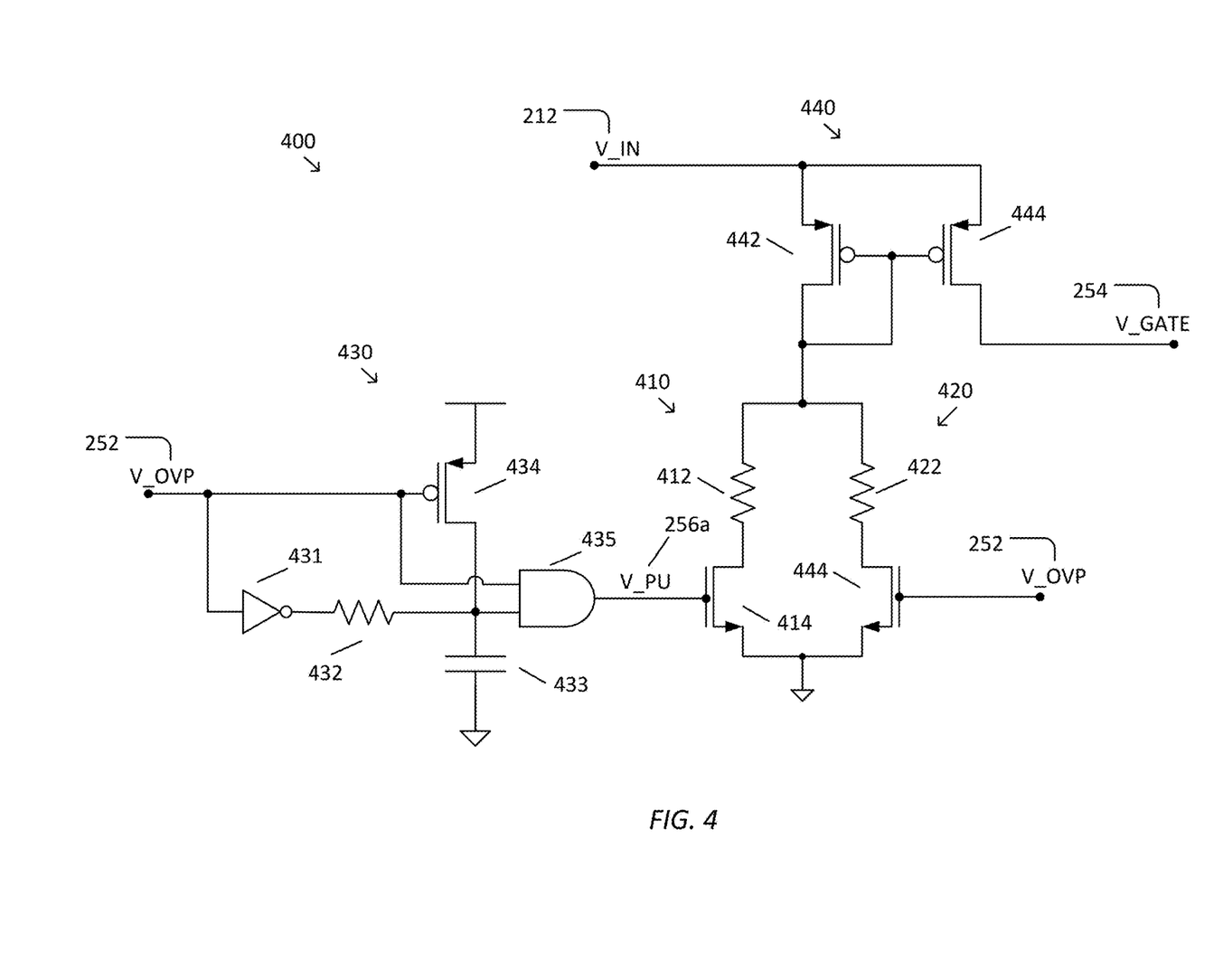
FIG. 4 is a simplified circuit diagram of a pull-up driver circuit according to some examples.

FIG. 4 is a simplified circuit diagram of a pull-up driver circuit 400 according to some examples. According to some embodiments consistent with FIG. 1-3, pull-up driver circuit 400 may be used to implement pull-up driver circuit 240a and/or pull-up driver circuit 300. Pull-up driver circuit 400 includes a boost sub-circuit 410, a steady state sub-circuit 420, a control circuit 430, and a current mirror 440. Current mirror 440 includes a pair of p-type switches 442 and 444 arranged in a current mirror configuration such that the current between input voltage 212 and gate voltage 254 matches the current drawn through switch 442 by boost sub-circuit 410 and steady state sub-circuit 420.

Boost sub-circuit 410 includes a resistor 412 and an n-type switch 414 configured in series with switch 442. Steady state sub-circuit 420, arranged in parallel with boost sub-circuit 410, also includes a resistor 422 and an n-type switch 424 configured in series with switch 442. Although boost sub-circuit 410 and steady state sub-circuit 420 may include the same types of components, according to some embodiments the resistance of resistor 422 may be much larger than the resistance of resistor 412. According to some embodiments, the resistance of resistor 412 may be 5 kΩ and the resistance of resistor 422 may be 100 kΩ. Accordingly, when switch 414 is turned on, a much larger current flows through the parallel combination of boost sub-circuit 410 and steady state sub-circuit 420 than when just switch 424 is turned on. The gate of switch 424 is coupled to receive over-voltage event indicator 252. Thus, switch 424 is conducting when over-voltage event indicator 252 is at a high voltage level, i.e., during an over-voltage event. The gate of switch 414 is coupled to receive voltage pulse 256a. Thus, switch 414 is conducting when voltage pulse 256a is at a high voltage level, i.e., during boost mode.

Control circuit 430 generates voltage pulse 256a when over-voltage event indicator 252 transitions from low to high. Control circuit 430 includes an inverter 431, a resistor 432, a capacitor 433, a p-type switch 434, and an AND gate 435. Resistor 432 and capacitor 433 are associated with an RC delay given by the product of the resistance of resistor 432 and the capacitance of capacitor 433. The RC delay determines the duration of voltage pulse 256a. According to some embodiments, the resistance of resistor 432 is 1 kΩ and the capacitance of capacitor 433 is 10 nF. In some examples, the duration of the voltage pulse generated by control circuit 430 is 10 μs.

Figure 5:
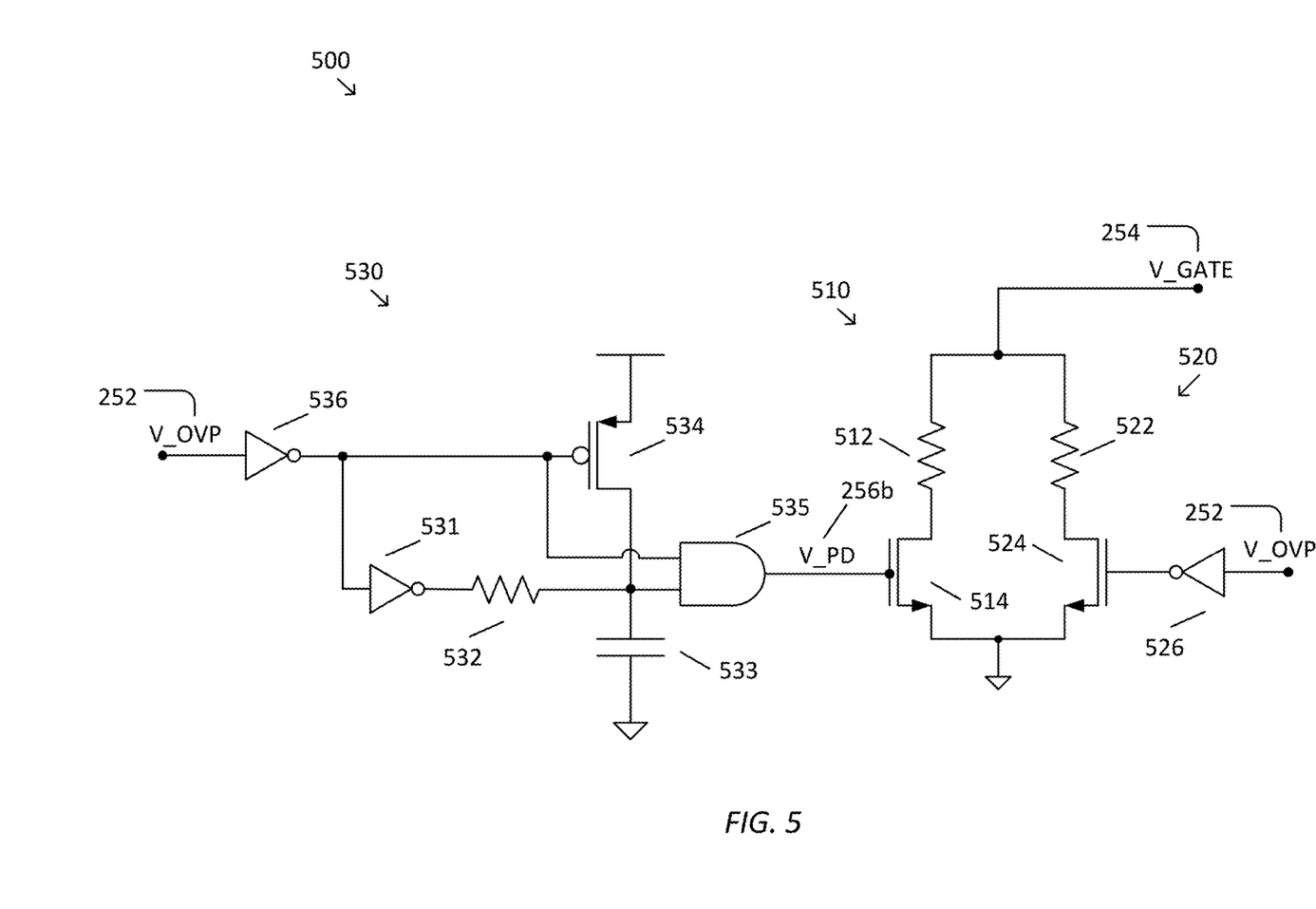
FIG. 5 is a simplified circuit diagram of a pull-down driver circuit according to some embodiments

FIG. 5 is a simplified circuit diagram of a pull-down driver circuit 500 according to some embodiments. According to some embodiments consistent with FIG. 1-2, pull-down driver circuit 500 may be used to implement pull-down driver circuit 240b. Pull-down driver circuit 500 includes a boost sub-circuit 510, a steady state sub-circuit 520, and a control circuit 530.

Boost sub-circuit 510 includes a resistor 512 and an n-type switch 514 configured in series between gate voltage 254 and ground. Steady state sub-circuit 520, arranged in parallel with boost sub-circuit 510, also includes a resistor 522 and an n-type switch 524 configured in series between node V_GATE 254 and ground. Although boost sub-circuit 510 and steady state sub-circuit 520 may include the same types of components, the resistance of resistor 522 may be much larger than the resistance of resistor 512 according to some embodiments. According to some embodiments, however, the difference between the resistances of resistors 512 and 522 may be smaller than the difference between the resistances of resistors 412 and 422 of pull-up driver circuit 400, as a slower response time in boost mode may be acceptable for turning on over-voltage protection switch 230 at the end of an over-voltage event than for turning off over-voltage protection switch 230 at the beginning of the over-voltage event. According to some embodiments, the resistance of resistor 512 may be 50 kΩ and the resistance of resistor 522 may be 100 kΩ Accordingly, when switch 514 is turned on, a much larger current flows through the parallel combination of boost sub-circuit 510 and steady state sub-circuit 520 than when just switch 524 is turned on. The gate of switch 524 is coupled to receive over-voltage event indicator 252 through an inverter 526. Thus, switch 524 is conducting when over-voltage event indicator 252 is at a low voltage level, i.e., during normal conditions (no over-voltage event). The gate of switch 514 is coupled to receive voltage pulse 256a. Thus, switch 514 is conducting when voltage pulse 256a is at a high voltage level, i.e., during boost mode.

Control circuit 530 generates voltage pulse 256b when over-voltage event indicator 252 transitions from high to low. Like control circuit 430, control circuit 530 includes an inverter 531, a resistor 532, a capacitor 533, a p-type switch 534, and an AND gate 535. Unlike control circuit 430, over-voltage event indicator 252 is inverted using an inverter 536. Resistor 532 and capacitor 533 are associated with an RC delay given by the product of the resistance of resistor 532 and the capacitance of capacitor 533. The RC delay determines the duration of the voltage pulse generated by control circuit 530. According to some embodiments, the resistance of resistor 532 is 1 kΩ and the capacitance of capacitor 533 is 10 nF. In some examples, the duration of the voltage pulse generated by control circuit 530 is 10 μs.

Figure 6:
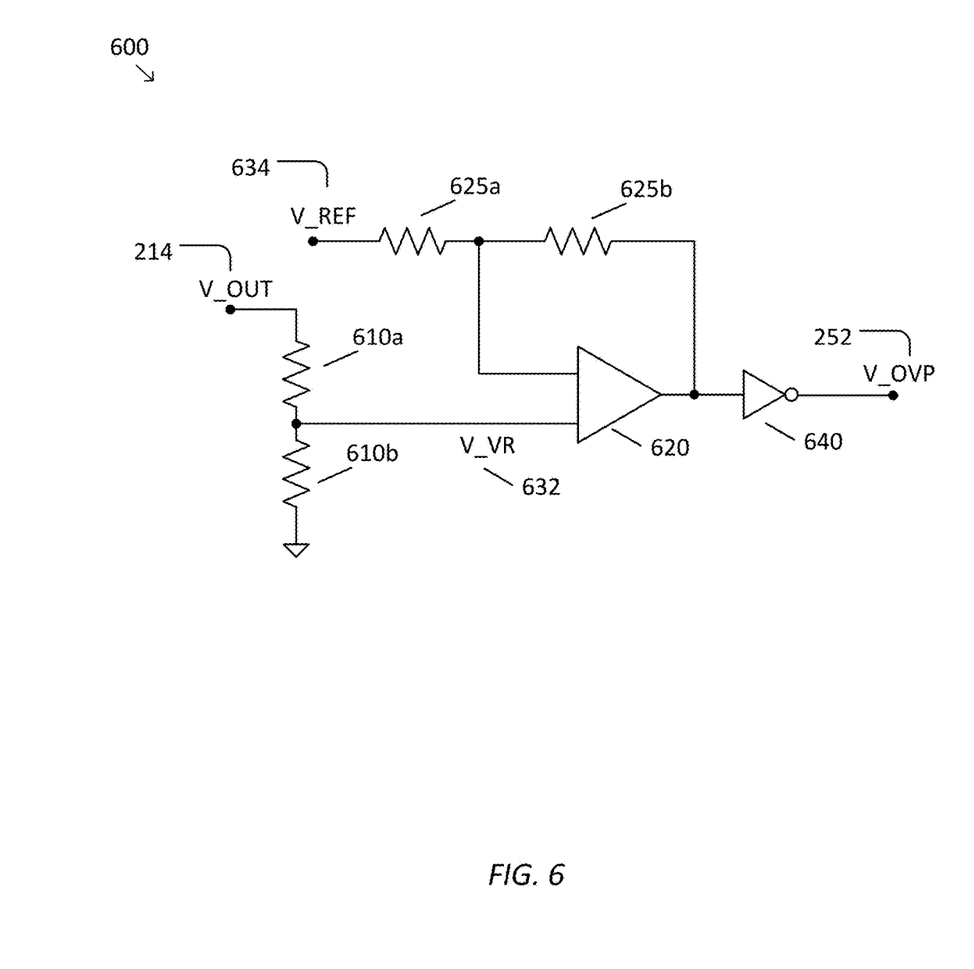
FIG. 6 is a simplified circuit diagram of an over-voltage event detector according to some examples

FIG. 6 is a simplified circuit diagram of an over-voltage event detector 600 according to some examples. In some embodiments consistent with FIGS. 1-3, over-voltage event detector 600 may be used to implement over-voltage event detector 230. Over-voltage event detector 600 generates over-voltage event indicator 252 in response to output voltage 214. In some examples, over-voltage event detector 600 may include a pair of resistors 610a-b arranged as a voltage divider. The voltage divider output 632 (V_VR) is coupled to a negative input of a comparator 620, which compares voltage divider output 632 to a reference voltage 634 (V_REF). According to some embodiments, the reference voltage is 2.5 V. A pair of resistors 622a-b is coupled between reference voltage 634, the positive input of comparator 620, and the output of comparator 620. In this configuration, comparator 620 operates with hysteresis (i.e., a low-high transition of the output occurs at a higher threshold voltage than the high-low transition). As discussed above with respect to FIG. 2, hysteresis may be desirable to reduce the switching frequency and/or noise sensitivity of over-voltage event detector 600. According to some embodiments, the amount of hysteresis is variable and/or dependent on input voltage 212. The output of comparator 620 is inverted using inverter 640 and transmitted via over-voltage event indicator 252.

Figure 7:
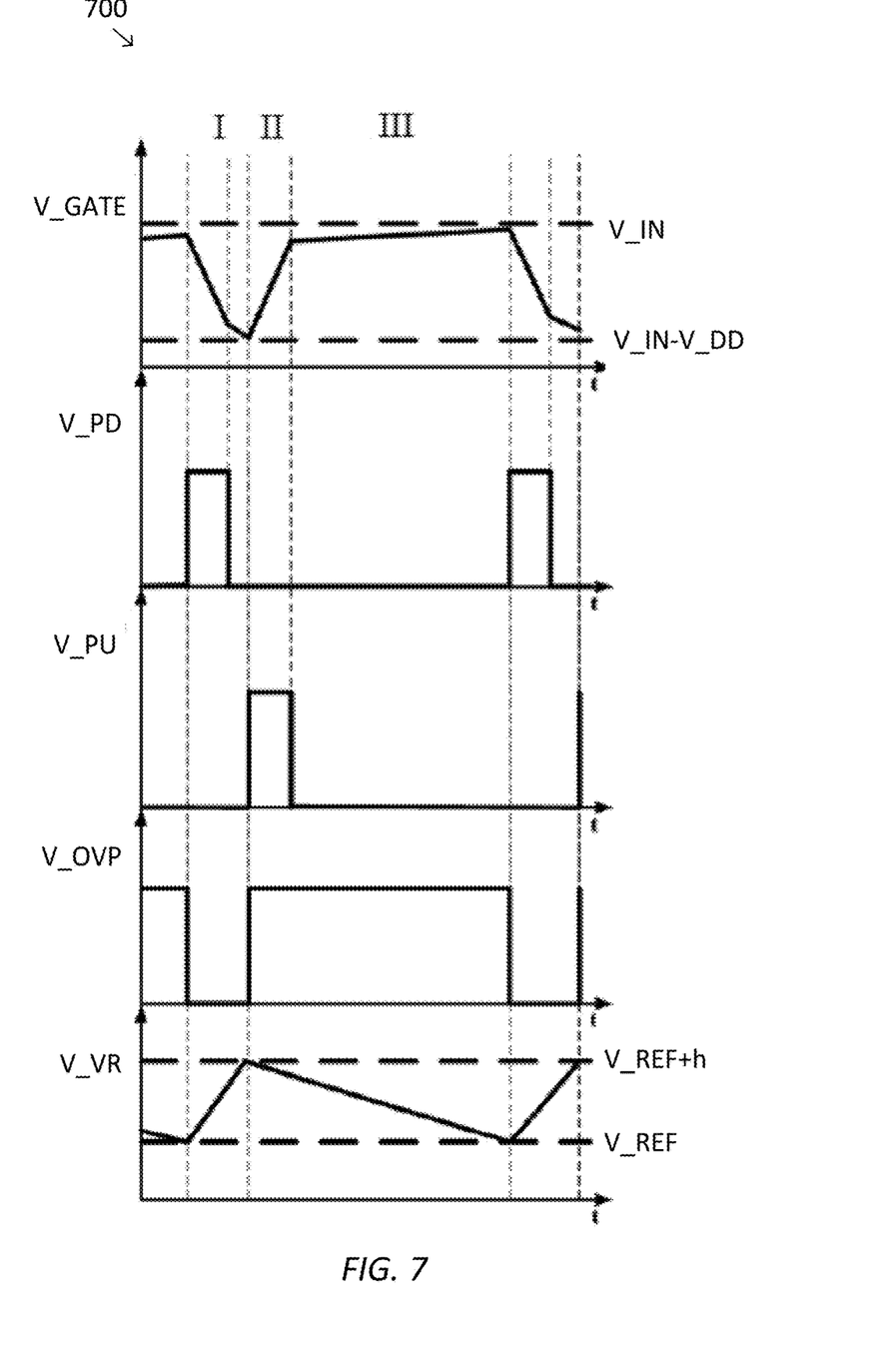
FIG. 7 is a simplified diagram showing qualitative waveforms that illustrate the operation of an over-voltage protection circuit according to some examples.

FIG. 7 is a simplified diagram showing qualitative waveforms 700 that illustrate the operation of an over-voltage protection circuit according to some examples. According to some embodiments consistent with FIGS. 1-6, waveforms 700 may illustrate the operation of over-voltage protection system 200. Consistent with such embodiments, waveforms 700 may correspond to probe data collected from nodes 254 (V_GATE), 256b (V_PD), 256a (V_PU), 252 (V_OVP), and 632 (V_VR) of over-voltage protection system 200.

At the beginning of stage I, V_VR (voltage divider output) decreases below V_REF (reference voltage), causing V_OVP (over-voltage event indicator) to transition from high to low. This situation may occur, for example, at the end of an over-voltage event. The high-low transition V_OVP triggers V_PD (voltage pulse), causing pull-down driver circuit 240b to enter boost mode. During boost mode, V_GATE (gate voltage) rapidly discharges through boost sub-circuit 242b. As depicted in FIG. 7, the slope of V_GATE is large during boost mode, representing the fast response time. Because over-voltage protection switch 220 turns on when V_GATE is discharged, the output voltage of over-voltage protection system 200 begins to rise. during stage I. Correspondingly, V_VR increases during stage I, as depicted in FIG. 7.

At the beginning of stage II, the V_VR increases above V_REF plus an additional voltage h, representing the hysteresis of comparator 620. This signifies an onset of an over-voltage event, which causes the V_OVP to transition from low to high. The low-high transition of the V_OVP triggers V_PU (voltage pulse), causing pull-up driver circuit 240a to enter boost mode. During boost mode, V_GATE rapidly charges through boost sub-circuit 242a. As depicted in FIG. 7, the slope of V_GATE is large during boost mode, representing the fast response time. As a result, the over-voltage protection switch 230 rapidly turns off in response to the detected over-voltage event.

At the end of stage II and beginning of stage III, boost mode ends (i.e., V_PU transitions from high to low). Meanwhile, the over-voltage event continues because V_VR remains higher than V_REF. Under these circumstances, the voltage of V_GATE is maintained using steady state sub-circuit 244a. As depicted in FIG. 7, the slope of V_GATE is small during boost mode because V_GATE is being charged through a high-resistance path. Although the rate at which V_GATE is charged is small, such behavior may be desired because it reduces energy losses. High charging current is generally not warranted in steady state operation because, if not all, of the gate charge used to turn off over-voltage protection switch 230 was already supplied during the boost mode. At the end of stage III, V_VR may drop below V_REF again, causing the cycle to repeat.

Figure 8:
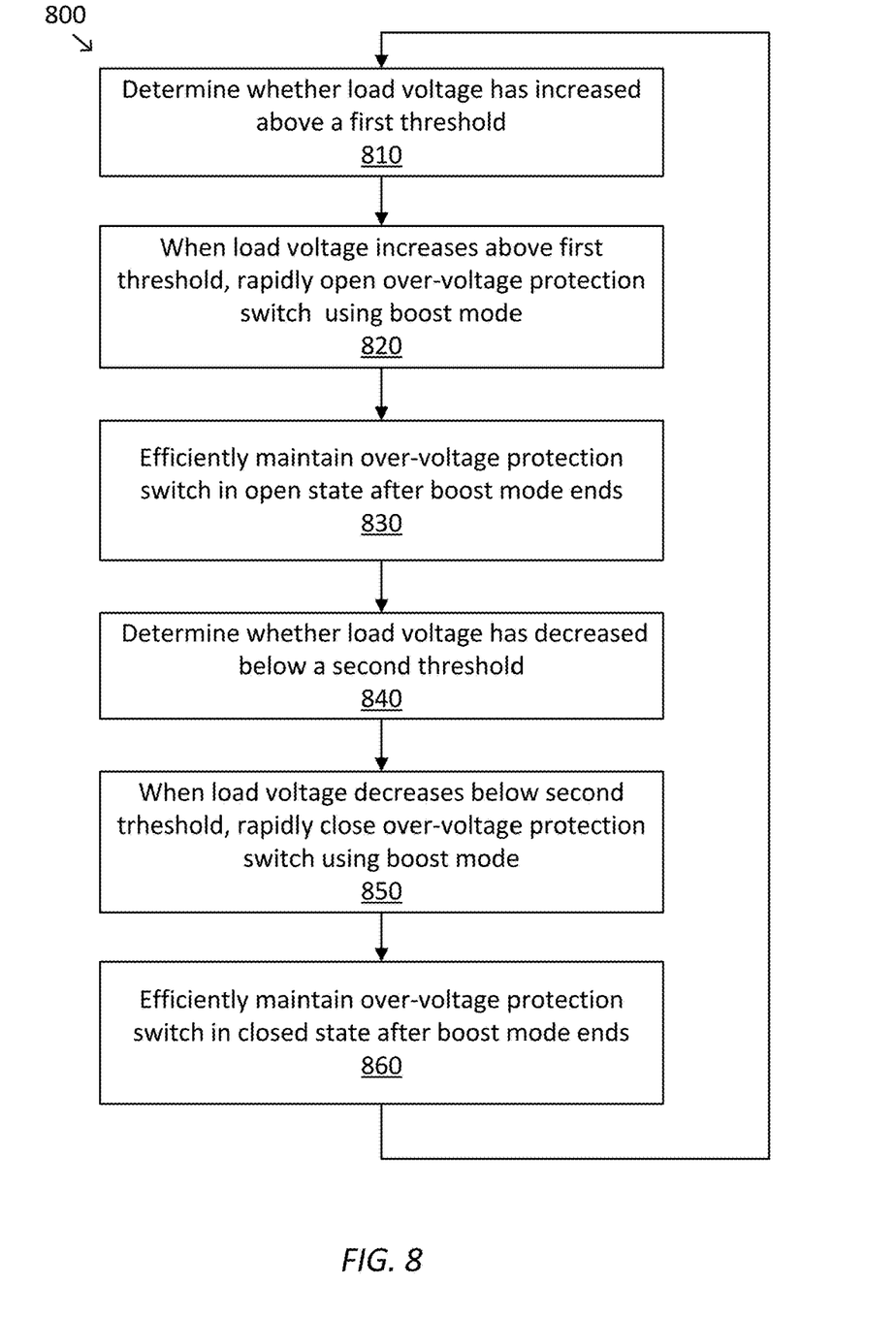
FIG. 8 is a simplified diagram showing a method of over-voltage protection according to some examples.

FIG. 8 is a simplified diagram showing a method 800 of over-voltage protection according to some examples. According to some embodiments consistent with FIGS. 1-7, method 800 may be performed by over-voltage protection system 200 and may result in voltage traces at various nodes that are similar to waveforms 700.

At a process 810, it is determined whether a load voltage has increased above a first threshold voltage. In some examples, the determination may be made using an over-voltage event detector, such as over-voltage event detector 230. When the load voltage has increased above the first threshold, method 800 proceeds to processes 820 and 830 for rapidly opening an over-voltage protection switch and subsequently maintaining the state of the switch. At a process 820, the over-voltage protection switch is rapidly opened using a boost mode. In some embodiments, the over-voltage protection switch may include a p-type pass-gate transistor, such as over-voltage protection switch 230. Consistent with such embodiments, the boost mode may include activating a low resistance path through a boost sub-circuit of a pull-up driver circuit, such as boost sub-circuit 242a, to charge the gate of the pass-gate transistor. According to some embodiments, boost mode may end after a predetermined time period, such as a predetermined duration based on an RC delay. At a process 330, the over-voltage protection switch is efficiently maintained in an open state after the boost mode ends. According to some embodiments, efficiently maintaining the switch in an open state may include de-activating the low resistance path through the boost sub-circuit and instead charging the gate of the pass-gate transistor through a high resistance path provided by a steady state sub-circuit of the pull-up driver circuit, such as steady state sub-circuit 244a. According to some embodiments, the high resistance path may accommodate sufficient current to prevent the level of the gate charge from drifting, but blocks the flow of large currents that would otherwise be inefficient and undesirable in the steady state.

At a process 840, it is determined whether the load voltage has decreased below a second threshold voltage. According to some embodiments, the second threshold voltage is lower than the first threshold voltage so as to provide hysteresis. As in process 810, the determination may be made using an over-voltage event detector, such as over-voltage event detector 230. When the load voltage has decreased below the second threshold, method 800 proceeds to processes 850 and 860 for rapidly closing the over-voltage protection switch and subsequently maintaining the state of the switch. At a process 850, the over-voltage protection switch is rapidly closed using a boost mode. As in process 820, the over-voltage protection switch may include a p-type pass-gate transistor, such as over-voltage protection switch 230. Consistent with such embodiments, the boost mode may include activating a low resistance path through a boost sub-circuit of a pull-down driver circuit, such as boost sub-circuit 242b, to discharge the gate of the pass-gate transistor. According to some embodiments, boost mode may end after a predetermined time period, such as a predetermined duration based on an RC delay. At a process 860, the over-voltage protection switch is efficiently maintained in a closed state after the boost mode ends. According to some embodiments, efficiently maintaining the switch in an open state may include de-activating the low resistance path through the boost sub-circuit and instead charging the gate of the pass-gate transistor through a high resistance path provided by a steady state sub-circuit of the pull-down driver circuit, such as steady state sub-circuit 244b. According to some embodiments, the high resistance path may accommodate sufficient current to prevent the level of the gate charge from drifting, but blocks the flow of large currents that would otherwise be inefficient and undesirable in the steady state.

Figure 9:
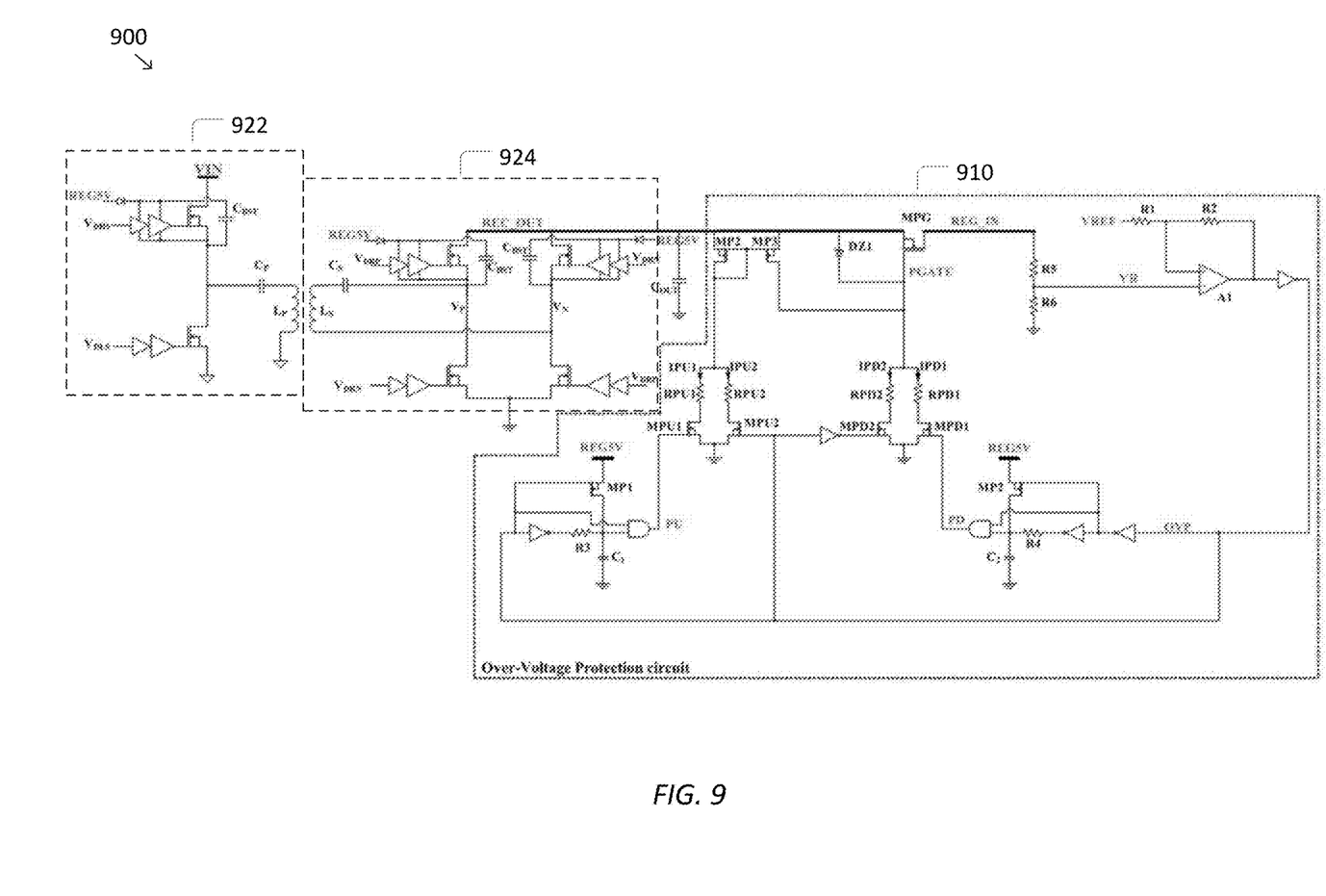
FIG. 9 is a simplified circuit diagram of an electronic circuit that provides over-voltage protection for a wireless power system according to some embodiments.

FIG. 9 is a simplified circuit diagram of an electronic circuit 900 that provides over-voltage protection for a wireless power system according to some embodiments. According to some embodiments consistent with FIGS. 1-8, circuit 900 may be used to implement at least some portions of electronic system 100. An over-voltage protection circuit 910 is placed between a wireless power transfer system and a following stage (not shown) that receives power through node REG_IN. The wireless power transfer system includes a wireless power transmitter 922 and a wireless power receiver 924. Wireless power receiver 924 rectifies the alternating current (AC) input power received form wireless power transmitter 922 to generate a direct current (DC) output voltage at node REC_OUT. Over-voltage protection circuit 910 includes a p-type pass-gate transistor MPG that couples nodes REC_OUT and REG_IN. MPD is turned on (conductive) when the gate voltage PGATE is low and turned off (non-conductive) when PGATE is high. When MPG is turned on, power is transferred from REC_OUT to REG_IN, increasing the voltage of REG_IN. When MPG is turned off, no power is transferred between REC_OUT and REG_IN, causing the voltage of REG_IN to decrease. The following stage after over-voltage protection circuit 110 may include any electronic load equipped to receive DC power from node REG_IN, such as a DC-DC regulator, a charger circuit, and/or the like.

Over-voltage protection circuit 910 includes driver circuitry that operates MPG (i.e. turns MPG on and off) so as to maintain the voltage of REG_IN within a predetermined range. The driver circuitry includes a pull-up driver circuit that includes node PU, n-type transistors MPU1 and MPU2, and resistors RPU1 and RPU2. According to some embodiments, RPU1 may have a much lower resistance than RPU2.

The driver circuitry further includes a pull-down driver circuit that includes node PD, n-type transistors MPD1 and MPD2, and resistors RPD1 and RPD2. According to some embodiments, RPD1 may have a much lower resistance than RPD2. The driver circuitry further includes a hysteretic comparator A1 that generates an over-voltage protection signal OVP based on whether an input voltage VR that is proportional to the voltage of REG_IN is greater than or less than a reference voltage VREF. Because of the hysteretic behavior of hysteretic comparator A1, the low-high transition of OVP occurs at a higher voltage (VREF+h) than the high-low transition (VREF). To reduce the transition frequency of OVP, for example, to conserve energy, the difference between VREF+h and VREF may be increased.

When OVP transitions from low to high, the pull-up network is activated to turn off MPG. The pull-up network is activated in two stages. In a first stage, node PU is high, thereby activating a low-resistance current path for charging the gate of MPG that includes RPU1. The rapid flow of current through RPU1 results in in MPG being quickly turned off. In the second stage, node PU is low, thereby deactivating the low-resistance path through RPU1. MPG remains turned off due to current flowing through a high resistance path that includes RPU2. However, because RPU2 has a higher resistance than RPU1, the steady state current consumption (i.e. the current consumption during the second stage) is much lower than the current consumption during the first stage. Accordingly, over-voltage protection circuit 910 benefits from low steady state current consumption without significantly compromising on the response time to an over-voltage event.

An analogous process occurs with respect to the pull-down network when OVP is low. When OVP transitions from high to low, the pull-down network is activated to turn on MPG. The pull-down network is activated in two stages. In a first stage, node PD is high, thereby activating a low-resistance current path for discharging the gate of MPG that includes RPD1. The rapid flow of current through RPD1 results in MPG being quickly turned on. In the second stage, node PD is low, thereby deactivating the low-resistance path through RPD1. MPG remains turned on due to current flowing through a high resistance path that includes RPD2. However, because RPD2 has a higher resistance than RPD1, the steady state current consumption (i.e. the current consumption during the second stage) is much lower than the current consumption during the first stage. Accordingly, over-voltage protection circuit 910 benefits from low steady state current consumption without significantly compromising on the response time to an over-voltage event.

According to some embodiments, the duration over which PU and PD are high following a low-high or high-low transition of OVP (i.e. the duration of the first stage), may be determined using delay circuits that include resistor R3 and capacitor C1 (for PU) and resistor R4 and capacitor C2 (for PD) among other components depicted in FIG. 9. As depicted in FIG. 9, the RC delay (i.e., the product of the resistance and capacitance) of the delay circuits determines how long PU and PD remain high during the first stage of an over-voltage event.

Although illustrative embodiments have been shown and described, a wide range of modification, change and substitution is contemplated in the foregoing disclosure and in some instances, some features of the embodiments may be employed without a corresponding use of other features. One of ordinary skill in the art would recognize many variations, alternatives, and modifications. Thus, the scope of the invention should be limited only by the following claims, and it is appropriate that the claims be construed broadly and in a manner consistent with the scope of the embodiments disclosed herein.

What is claimed is:

1. An over-voltage protection system comprising:
   a switch coupled between a power source and a load;
   a detection circuit configured to detect an onset of an over-voltage event at the load; and
   a driver circuit coupled to the switch and the detection circuit, wherein the driver circuit includes:
   a boost sub-circuit that provides a low-resistance path for opening the switch in a boost mode, the boost mode being triggered by the onset of the over-voltage event and having a predetermined duration; and
   a steady state sub-circuit that provides a high-resistance path for holding the switch open during steady state operation when the boost mode ends,
   wherein the driver circuit is a pull-up driver circuit coupled between a gate of the pass-gate transistor and a source of the pass-gate transistor, the source of the pass-gate transistor being coupled to the power source, the pull-up driver circuit further including a current mirror coupled between the gate and the source of the pass-gate transistor, the current mirror generating a current between the gate and the source of the pass-gate transistor that matches a current drawn by the boost sub-circuit and the steady state sub-circuit.

2. The system of claim 1, wherein the switch includes a p-type pass-gate transistor.

3. The system of claim 1, wherein the pull-up driver circuit further includes a control sub-circuit coupled between the detection circuit and the boost sub-circuit, the control sub-circuit transmitting a voltage pulse to the boost sub-circuit in response to receiving an over-voltage event indicator from the detection circuit, wherein a duration of the voltage pulse determines the predetermined duration of the boost mode.

4. The system of claim 1, wherein the detection circuit is further configured to detect an end of the over-voltage event at the load.

5. The system of claim 4, wherein the onset of the over-voltage event occurs when a voltage at the load increases above a first predetermined threshold, and the end of the over-voltage event occurs when the voltage at the load decreases below a second predetermined threshold.

6. The system of claim 5, wherein the first predetermined threshold is greater than the second predetermined threshold.

7. The system of claim 4, further comprising a second driver circuit, the second driver circuit including:
   a second boost sub-circuit that provides a second low-resistance path for closing the switch in a second boost mode, the second boost mode being triggered by the end of the over-voltage event and having a second predetermined duration;
   a second steady state sub-circuit that provides a second high-resistance path for holding the switch closed during steady state operation when the second boost mode ends.

8. The system of claim 7, wherein the driver circuit is a pull-up driver circuit and the second driver circuit is a pull-down driver circuit.

9. An over-voltage protection circuit comprising:
   a pass-gate transistor coupled between a power source and a load;

an over-voltage detection circuit configured to detect a beginning of an over-voltage event at the load; and a driver circuit coupled to a gate of the pass-gate transistor, wherein the driver circuit includes:

a boost sub-circuit that provides a low-resistance path for charging the gate of the pass-gate transistor in a boost mode, the boost mode being triggered by the beginning of the over-voltage event and having a predetermined duration; and a steady state sub-circuit that provides a high-resistance path for maintaining the gate of the pass-gate transistor in a charged state during steady state operation, wherein the boost sub-circuit includes a first resistor and an n-type transistor coupled in series, and wherein a gate of the n-type transistor receives a voltage pulse that causes a first charging current to flow through the boost sub-circuit for a duration of the voltage pulse.

10. The circuit of claim 9, wherein the steady state sub-circuit includes a second resistor and an n-type transistor coupled in series, and wherein the gate of the n-type transistor receives an over-voltage event indicator that causes a second charging current to flow through the steady state sub-circuit.

11. The circuit of claim 10, wherein the boost sub-circuit and the steady state sub-circuit are arranged in parallel and a resistance of the first resistor is smaller than a resistance of the second resistor, causing the first charging current to be larger than the second charging current.

12. The circuit of claim 11, wherein the resistance of the first resistor is 5 kΩ and the resistance of the second resistor is 100 kΩ.

13. The circuit of claim 10, wherein the driver circuit further comprises a control sub-circuit that generates the voltage pulse in response to the over-voltage event indicator, the voltage pulse having a duration determined based on an RC delay.

14. The circuit of claim 9, wherein the detector circuit includes a comparator with hysteresis for determining a beginning and end of an over-voltage event at the load.

15. A method comprising:

determining whether a load voltage has increased above a first threshold value;

opening an over-voltage protection switch using a boost mode when the load voltage has increased above first threshold value by providing a voltage pause to a gate of a transistor coupled in series with a resistor coupled to control the over-voltage protection switch, the voltage pulse causing a first current to flow through a boost circuit for a duration of the voltage pulse;

maintaining the over-voltage protection switch in an open state when the boost mode ends.

16. The method of claim 15, further comprising:

determining whether the load voltage has decreased below a second threshold value;

closing the over-voltage protection switch using a second boost mode when the load voltage has decreased below the second threshold value; and maintaining the over-voltage protection switch in a closed state when the second boost mode ends.

17. The method of claim 15, wherein:

the boost mode further includes activating a low resistance path to charge a gate of the over-voltage protection switch; and maintaining the over-voltage protection switch in the open state further includes activating a high resistance path to prevent a voltage of the gate of the over-voltage protection switch from drifting.

* * * * *